United States Patent
Chen et al.

(10) Patent No.: US 7,981,307 B2
(45) Date of Patent: Jul. 19, 2011

(54) METHOD AND APPARATUS FOR SHAPING GAS PROFILE NEAR BEVEL EDGE

(75) Inventors: Jack Chen, Fremont, CA (US); Andrew D. Bailey, III, Pleasanton, CA (US); Iqbal Shareef, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 828 days.

(21) Appl. No.: 11/866,392

(22) Filed: Oct. 2, 2007

(65) Prior Publication Data

US 2009/0084758 A1    Apr. 2, 2009

(51) Int. Cl.
*B44C 1/22*    (2006.01)
*H01L 21/00*   (2006.01)

(52) U.S. Cl. ............ 216/67; 216/58; 438/706; 438/710; 134/1.1; 134/2; 134/22.18

(58) Field of Classification Search ............... 216/58, 216/67; 438/706, 710; 134/1.1, 2, 22.18
See application file for complete search history.

(56) References Cited

U.S. PATENT DOCUMENTS

| | | | | |
|---|---|---|---|---|
| 5,693,241 A * | 12/1997 | Banks et al. | ............. | 219/121.11 |
| 6,004,631 A | 12/1999 | Mori | ............. | 427/534 |
| 6,020,268 A | 2/2000 | Cheng | ............. | 438/14 |
| 2002/0007790 A1 * | 1/2002 | Park | ............. | 118/715 |
| 2005/0173067 A1 | 8/2005 | Lim | ............. | 156/345.43 |

* cited by examiner

*Primary Examiner* — Shamim Ahmed
(74) *Attorney, Agent, or Firm* — Martine Penilla & Gencarella, LLP

(57) ABSTRACT

A method for etching a bevel edge of a substrate in a processing chamber is provided. The method includes flowing an inert gas into a center region of the processing chamber defined above a center region of the substrate and flowing a mixture of an inert gas and a processing gas over an edge region of the substrate. The method further includes striking a plasma in the edge region, wherein the flow of the inert gas and the flow of the mixture maintain a mass fraction of the processing gas substantially constant. A processing chamber configured to clean a bevel edge of a substrate is also provided.

20 Claims, 6 Drawing Sheets

METHOD AND APPARATUS FOR SHAPING GAS PROFILE NEAR BEVEL EDGE

BACKGROUND

As feature sizes are becoming smaller and smaller, the cleaning of the edge region of the wafer is becoming more difficult. In addition, as newer cleaning techniques are being adapted for the manufacturing process to achieve the smaller feature sizes, there are different process chemistries being utilized for these techniques. Some of these processing chemistries may be corrosive to the active portion of the wafer, i.e., the region of the wafer where the chips reside. Another consequence of the shrinking feature sizes is that the edge exclusion zone is becoming smaller. Thus any cleaning of the edge must be directed to the edge so that the corrosive chemistries do not impact the remainder of the wafer. Currently, techniques are being developed in order to facilitate the cleaning of the edge so that any particulates or contamination can be removed from the processing performed on the substrate. However, there is a need to be able to clean the edge without affecting the center portion of the wafer. As new processes are being used for wafer processing, this need will become more apparent especially with the use of corrosive processing gases as cleaning chemistries.

In view of the foregoing, there is a need for systems and methods for cleaning a bevel edge of a wafer as this region is becoming smaller and to perform the cleaning without impacting the center region.

SUMMARY

Broadly speaking, the embodiments fill the need by providing a method and system for etching an edge of the substrate to clean the substrate while preventing a center region of the substrate from experiencing any harmful plasma species. It should be appreciated that the present invention can be implemented in numerous ways, including as a solution, a method, a process, an apparatus, or a system. Several inventive embodiments of the present invention are described below.

In one embodiment, a method for etching a bevel edge of a substrate in a processing chamber is provided. The method includes flowing an inert gas into a center region of the processing chamber defined above a center region of the substrate and flowing a mixture of an inert gas and a processing gas over an edge region of the substrate. The method further includes striking a plasma in the edge region, wherein the flow of the inert gas and the flow of the mixture maintain a mass fraction of the processing gas substantially constant.

In another embodiment, a method for cleaning a bevel edge of a substrate is provided. The method initiates with flowing an inert gas into a center region of the processing chamber defined above a center region of the substrate. An etchant gas flows over an edge region of the substrate contemporaneously with the flowing of the inert gas. The method includes striking a plasma in the edge region through opposing annular electrodes proximate to the edge region, wherein the flow of the inert gas and the flow of the etchant gas maintain a mass fraction of the etchant gas substantially constant at the edge region while preventing the etchant gas from diffusing into the center region.

In yet another embodiment, a processing chamber is provided. The processing chamber includes a substrate support and a pair of annular electrodes disposed over an edge region of the substrate support. The processing chamber includes a gas distribution system having a first gas inlet providing an inert gas over a center region of the substrate and a second gas inlet providing a processing gas proximate to the edge region. A pressure control system controlling a pressure inside the chamber is included. The processing chamber includes a processor controlling the inert gas and the processing gas introduced into the chamber as well as the pressure inside the chamber. A memory in data communication with the processor is provided. The memory stores a program to be operated on by the processor. The program includes a first subroutine to control flow rates of the processing gas at the edge region and the inert gas over the center region in order to maintain a mass fraction of the processing gas at the edge region substantially constant. A second subroutine to control mixing of the processing gas with another gas is also provided.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

The embodiments described herein provide a method for controlling the etch rate at the edge of a wafer while protecting a center region of the wafer from the edge etch. In one embodiment, a center gas supply is used to introduce a processing gas at a flow rate that is relatively high as compared to typical etching operations. In addition, the pressure within the chamber is at 1 Torr or greater in order to achieve the processing in the regime desired. In a second embodiment, the center gas supply is used to supply an inert gas while an edge gas supply delivers the processing gas to the edge region of the wafer. In this embodiment, the center gas buffers the center region of the wafer from the processing gases of the edge region to prevent diffusion into the center region. In another embodiment, the center gas supply is used to supply an inert gas to the center region of the wafer, while a mixture of an inert gas and a process gas is supplied to the edge region. It should be appreciated that the inert gas supplied at the edge region and the inert gas supplied at the center region may or may not be the same gas.

Figure 1:
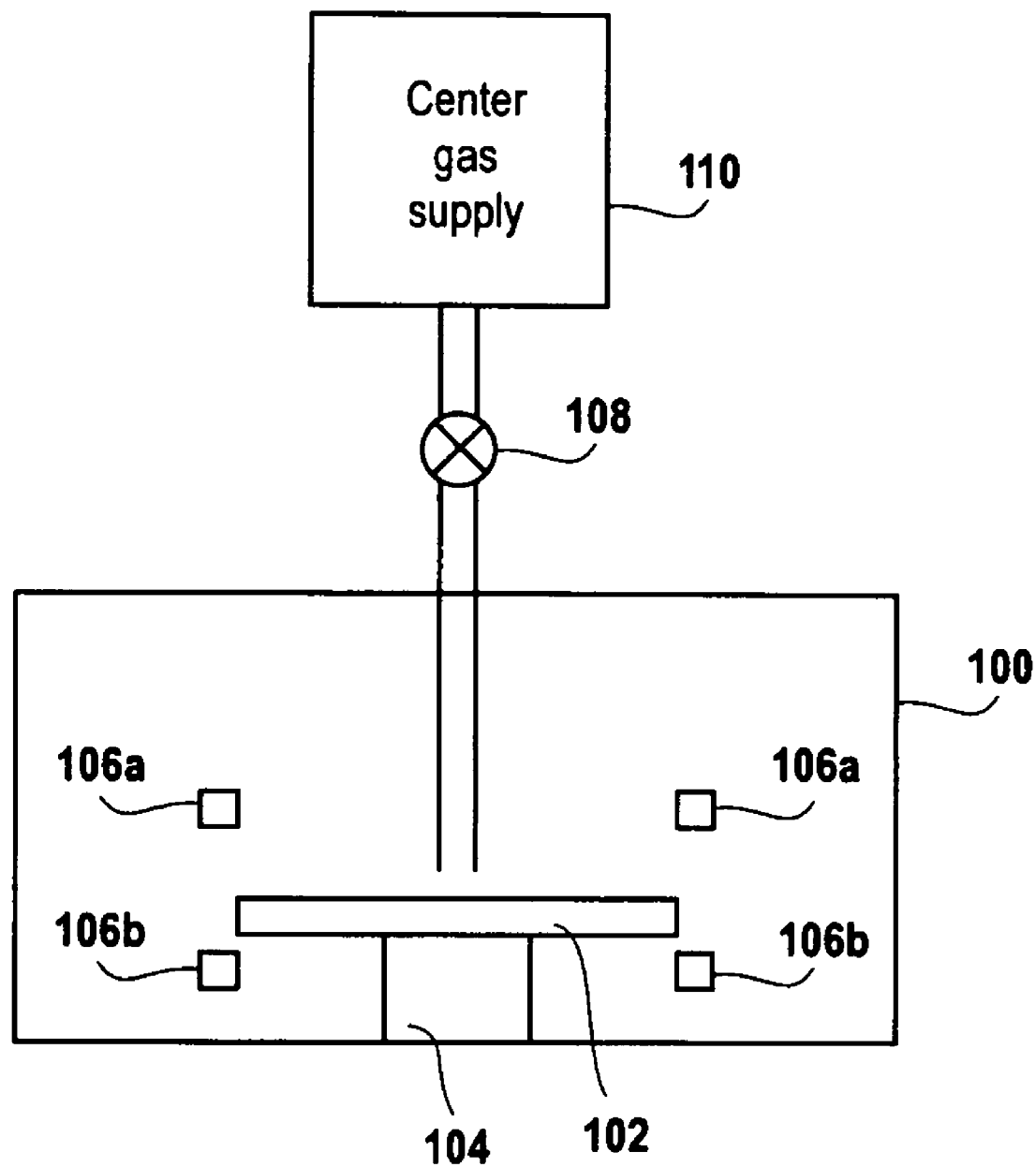
FIG. 1 is a simplified schematic diagram illustrating a processing chamber in which the edge of a wafer is etched in accordance with one embodiment of the invention.

FIG. 1 is a simplified schematic diagram illustrating a processing chamber in which the edge of a wafer is etched in accordance with one embodiment of the invention. Chamber 100 includes edge electrodes 106a and 106b. Edge electrode 106a is a top electrode disposed around an outer perimeter of substrate 102, while edge electrode 106b is a bottom electrode disposed opposing top electrode 106a and below an outer region of substrate 102. In one embodiment, edge electrodes 106a and 106b are annular rings. Substrate 102 which may act as an electrode rests on substrate support 104. In one embodiment, substrate support 104 may be an electrostatic chuck. Center gas supply 110 introduces a gas supply through mass flow controller 108 into a center region of chamber 100. In one embodiment, the gas supply from center gas supply 110 flows into the chamber at approximately 1000 standard cubic centimeters per meter (SCCM). In another embodiment, the flow rate of the gas is greater than 1000 SCCM. The processing gas used in the embodiments herein may be any processing gas commonly used to perform etching operations during semiconductor processing. Exemplary process gases include oxygen ($O_2$), $SF_6$, chlorine ($Cl_2$), $CF_4$ and any inert gases such as argon, nitrogen, etc., may be supplied with the process gas. Numerous other process gases utilized in semiconductor manufacturing may be included in the embodiments discussed herein. It should be appreciated that the pressure within chamber 100 is kept at 1 Torr or greater in on embodiment. In this pressure regime the diffusion effects from the gas/ions around the outer edge during the etching operation are offset by the momentum effect of the gas from the center region.

Figure 2:
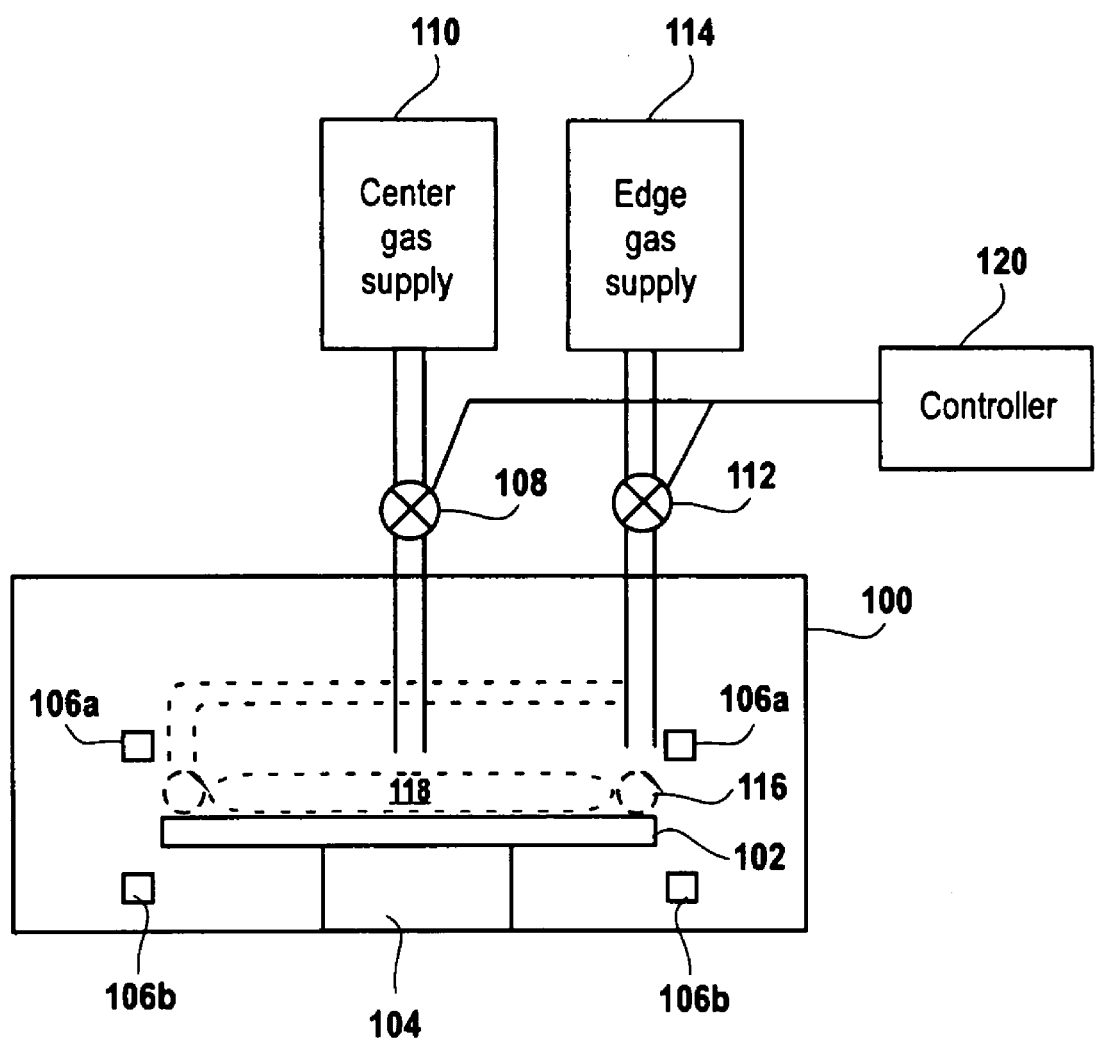
FIG. 2 is an alternative embodiment to the chamber of FIG. 1 where an edge gas supply is included along with a center gas supply.

FIG. 2 is an alternative embodiment to the chamber of FIG. 1 where an edge gas supply is included along with a center gas supply. Chamber 100 includes electrodes 106a and 106b disposed therein. Wafer 102 rests upon substrate support 104. Center gas supply 110 supplies an inert gas into a center region of the chamber through mass flow controller 108. As illustrated in region 118 the center gas supply buffers the center region of the wafer to protect the devices defined thereon. Edge gas supply 114 supplies an edge gas to edge region 116 which is proximate to an outer perimeter of substrate 102 and between electrodes 106a and 106b. The edge gas supply is supplied through mass flow controller 112. Controller 120 may be used to operate the mass flow controllers in order to provide the desired flow rates and mass flow of the process gas and inert gas into the chamber. In one embodiment, controller 120 is a computing device having a processor and a memory. In this embodiment, the memory may include code. The code may include subroutines that control operation of mass flow control valves 108 and 112 in order to achieve the flow rates and mass fraction described herein. In addition, the code may include subroutines or instructions for controlling pressure within the chamber. As illustrated in FIG. 2, region 116 depicts a region where the edge gas is defined within chamber 100. Again, the pressure within the chamber is controlled at 1 Torr or greater. In one embodiment, the pressure is maintained at 1.5 Torr or greater. It should be appreciated that at the higher pressure the diffusion effect of the gas at the edge is dominated by the momentum effect from the center gas supply. That is, there are many more collisions and the main free path is very short in this pressure regime. In addition, the inert gas supplied through center gas supply 110 may be any suitable inert gas such as nitrogen, argon, etc. In one embodiment an inert gas having a higher molecular weight may be preferable, however, it is not necessary.

Figure 3:
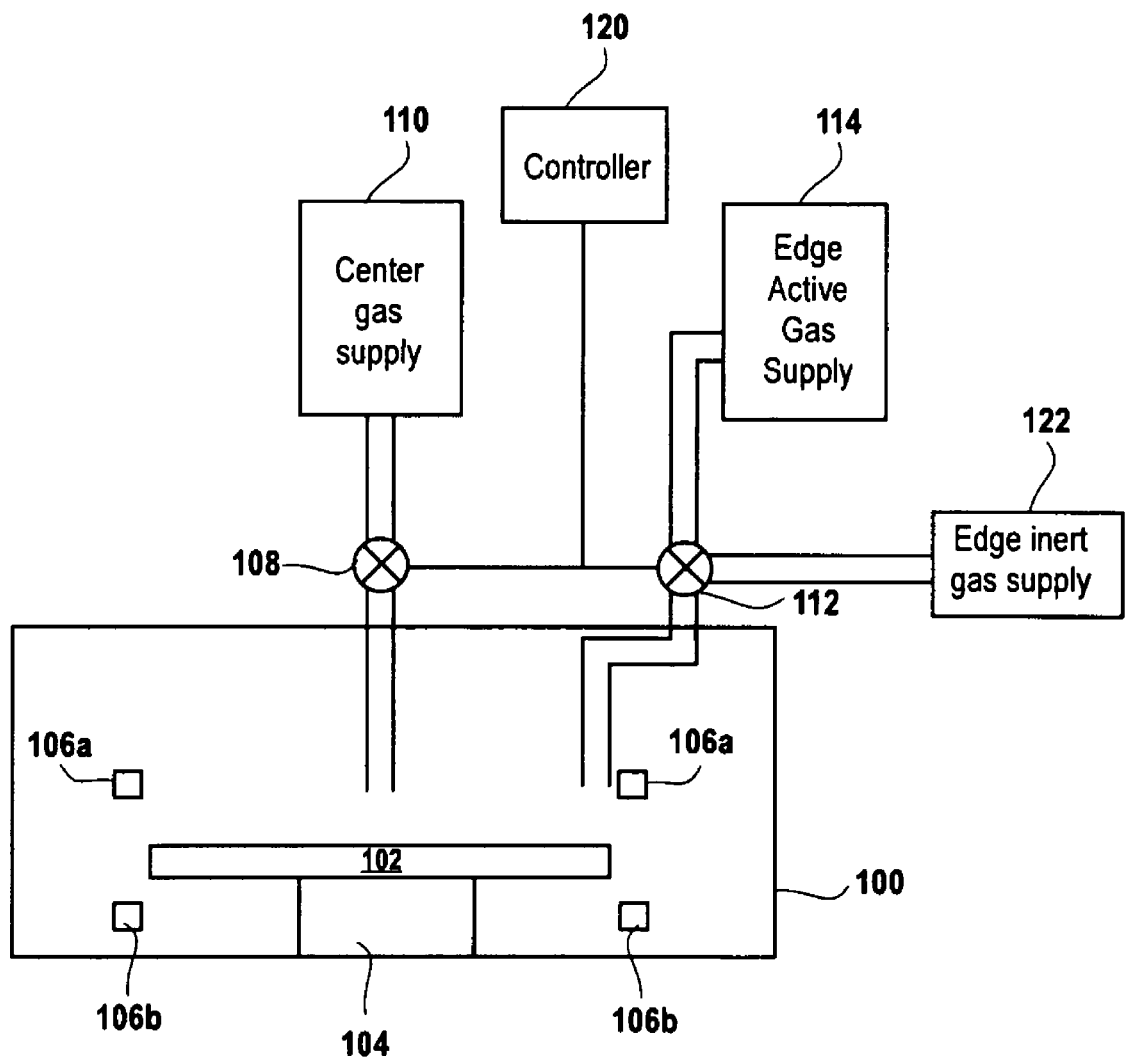
FIG. 3 illustrates an alternative embodiment to the gas supply setup illustrated in FIGS. 1 and 2 for etching an edge of a wafer in accordance with one embodiment of the invention.

FIG. 3 illustrates an alternative embodiment to the gas supply setup illustrated in FIGS. 1 and 2 for etching an edge of a wafer in accordance with one embodiment of the invention. Chamber 100 here again includes electrodes 106a and 106b disposed around an outer perimeter of wafer 102 which is resting on substrate support 104. Center gas supply 110 introduces a center gas to the center region defined over substrate 102 through mass flow controller 108. Process gas is delivered to the edge region from edge active gas supply 114 and edge inert gas supply 122. These supplies are delivered through mass flow controller 112 to the edge region defined around the perimeter of substrate 102. Controller 120 monitors the operation of mass flow controllers 108 and 112 to deliver the desired ratios of gases. It should be appreciated that in this embodiment, the mass fractions are able to be controlled through controller 120 and corresponding mass flow controllers. In one embodiment, the gas flow through mass flow controller 112 mixes an inert gas with a process gas. As discussed above the process gas will generate a cleaning plasma. The inert gas may or may not be the same inert gas delivered to the center region through mass flow controller 108.

Figure 4:
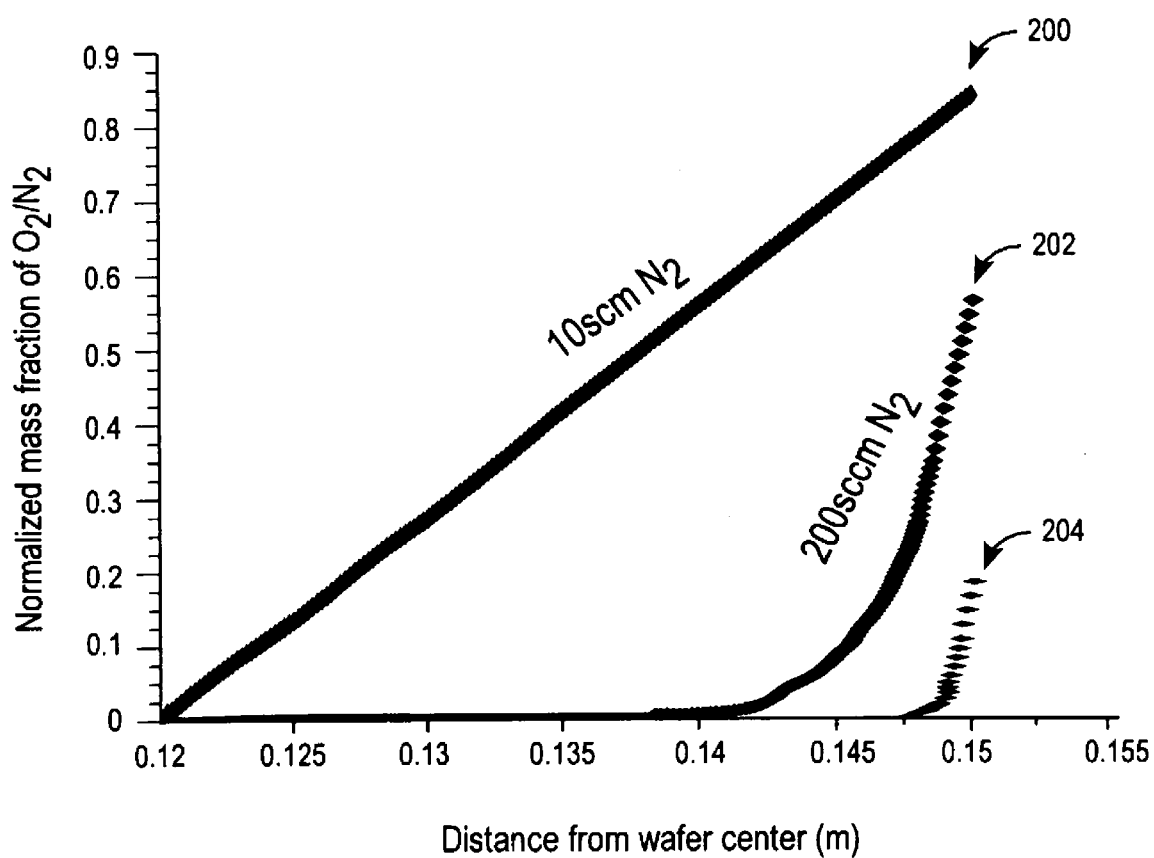
FIG. 4 is a simplified graph illustrating the comparison of mass fractions between the three purge gases emissions in accordance with one embodiment of the invention.

FIG. 4 is a simplified graph illustrating the comparison of mass fractions between the purge gas flow rates in accordance with one embodiment of the invention. The Y axis provides the mass fraction ratio of oxygen to nitrogen. The X axis illustrates the distance from the wafer center in meters. Line 200 illustrates a center gas feed being supplied at 10 sccm of nitrogen. As illustrated, line 200 represents a linear relationship between the distance from the wafer center and the mass fraction. As the flow rate of nitrogen in the center region is increased to 200 sccm the etch profile becomes steeper as illustrated by line 202. In addition, when the flow rate of nitrogen is increased to 1000 sccm the etch profile becomes even steeper at the edge of the wafer as illustrated by line 204. However, in this profile which is representative of the center gas feed supplying an inert gas and an edge gas supply supplying a single active gas, such as oxygen, the process chemistries differ drastically in terms of the mass fraction as illustrated by the end points for each of line 200, 202, and 204, which range from 0.1 to 0.9.

Figure 5:
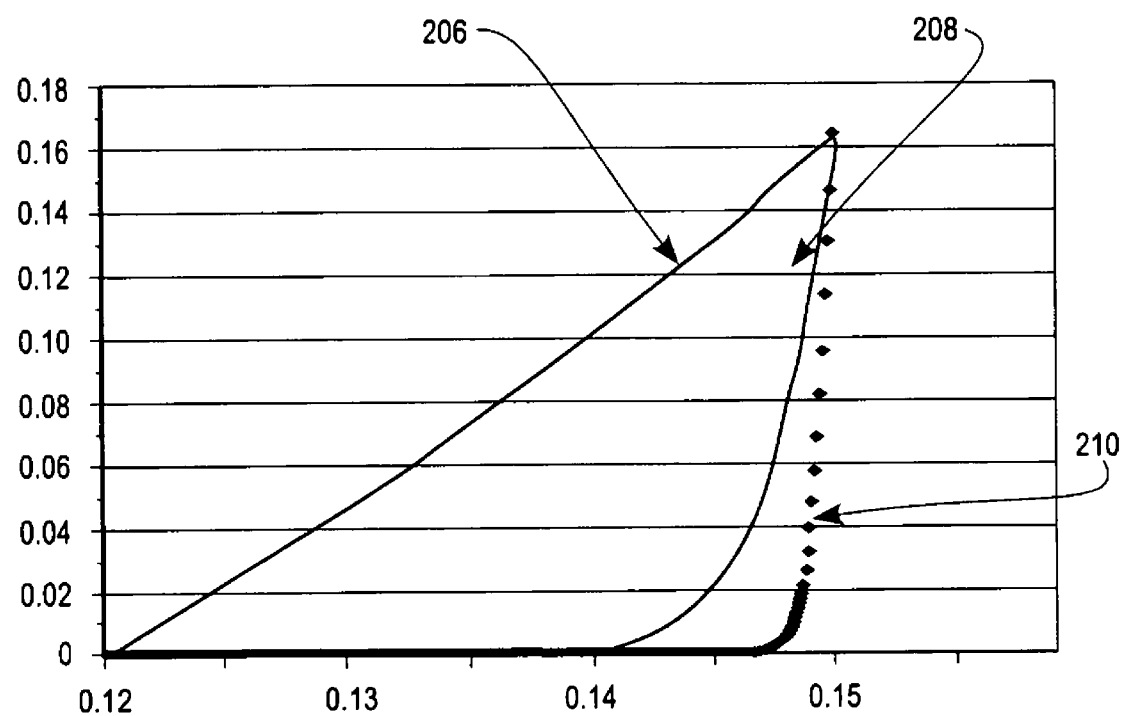
FIG. 5 illustrates a graph representing the oxygen mass fraction versus the distance along the wafer in accordance with one embodiment of the invention.

FIG. 5 illustrates a graph representing the oxygen mass fraction versus the distance along the wafer in accordance with one embodiment of the invention. Line 206 illustrates a condition in which the purge gas through the center is delivered at 10 sccm while the active gas at the edge is supplied at 200 sccm and the edge inert gas is supplied at 990 sccm. It should be appreciated that the edge inert gas may be referred to as a ballast gas. Line 208 represents conditions where the purge gas through the center is supplied at 200 sccm, the process gas at the edge is supplied at 200 sccm and the ballast gas is supplied at 800 sccm. In line 210 the conditions are that the purge is supplied at 800 sccm and the process gas at the edge is supplied at 200 sccm, while the edge inert gas is not being supplied in this representation. It should be appreciated that the process chemistries at the edge remain consistent in this embodiment as illustrated by the common endpoints for lines 206, 208, and 210. Thus for each of the cases described above, the profile of the etch process is shaped as needed and the mass fraction of the process gas at the edge region remains consistent.

Figure 6:
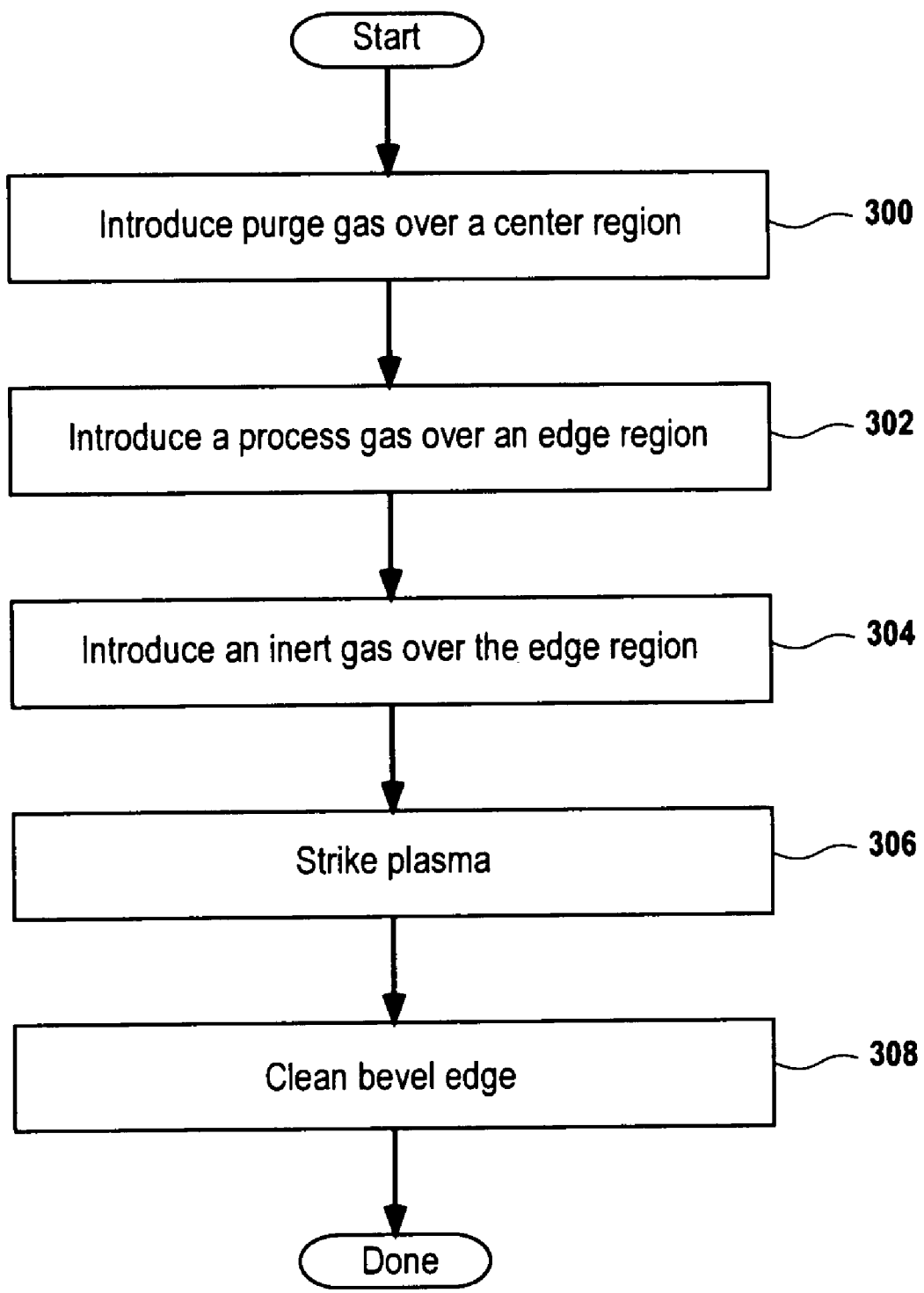
FIG. 6 is a flow chart diagram illustrating the method operations for etching an edge of a substrate in accordance with one embodiment of the invention.

FIG. 6 is a flow chart diagram illustrating the method operations for etching an edge of a substrate in accordance with one embodiment of the invention. The method initiates with operation 300 where a purge gas is introduced into a center region of a chamber over a center region of a substrate disposed in the chamber. As illustrated in the figures above, the purge gas may be introduced at a flow rate of greater than 200 sccm. In one embodiment, the flow rate of the purge gas is greater than 1000 sccm. The method then advances to operation 302 where a process gas is introduced over an edge region of a wafer within the processing chamber. The process gas may be introduced contemporaneously with the purge gas of operation 300. The process gas may be any suitable process gas used for etching a substrate. In one embodiment, oxygen is introduced into the chamber over the edge region as the process gas. The flow rate of the oxygen may be 200 sccm or greater. The method then advances to operation 304 wherein an inert gas is introduced over the edge region contemporaneously with the process gas. In one embodiment, the inert gas is mixed with the process gas prior to introduction into the chamber. The inert gas may or may not be the same composition as the purge gas from operation 300. It should be appreciated that introduction of the inert gas over the edge region in operation 304 is an optional operation. That is, the inert gas may or may not be combined with the process gas for introduction into the chamber in one embodiment of the invention. In one embodiment the inert gas mixed with the process gas is different than the inert gas introduced into the center region. In this embodiment, the inert gas mixed with the process gas has a lower molecular weight than the inert gas introduced into the center region. The method then moves to operation 306 where a plasma is struck while introducing the gases described above. In operation 308 the edge of the wafer is etched while the center region of the substrate is protected from the corrosive chemicals and etching operation. One skilled in the art will appreciate that the embodiments described below allow for the avoidance of the use of a shield or insert to protect the center region from corrosive species.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, such as the carrier network discussed above, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:

1. A method for etching a bevel edge of a substrate in a processing chamber, comprising:
   flowing an inert gas into a center region of the processing chamber defined above a center region of the substrate;
   flowing a mixture of an inert gas and a processing gas over an edge region of the substrate;
   striking a plasma in the edge region, wherein the flow of the inert gas and the flow of the mixture maintain a mass fraction of the processing gas between about 0.1 and 0.2.

2. The method of claim 1, further comprising:
   maintaining a pressure in the edge region of between about 1 Torr and 2 Torr.

3. The method of claim 1, wherein a flow rate of the inert gas into the center region is greater than a flow rate of a flow rate of the inert gas and the processing gas over the edge region.

4. The method of claim 1 wherein a flow rate of the inert gas in the mixture is a fraction of a flow rate of the inert gas to the center region.

5. The method of claim 1, wherein the inert gas flowing into the center region is a same gas as the inert gas flowing to the edge region.

6. The method of claim 1, wherein a mass fraction of the processing gas in the center region is maintained at about zero during the etching.

7. The method of claim 1, wherein a flow rate of the inert gas in the mixture is a fraction of a flow rate of the inert gas to the center region and a flow rate of the processing gas is equivalent to the flow rate of the inert gas to the center region.

8. The method of claim 1, wherein a molecular weight of the inert gas in the mixture is less than a molecular weight of the inert gas flowing to the center region.

9. A method for cleaning a bevel edge of a substrate, comprising:
   flowing an inert gas into a center region of the processing chamber defined above a center region of the substrate;
   flowing a process gas over an edge region of the substrate; and
   striking a plasma in the edge region through opposing annular electrodes proximate to the edge region, wherein the flow of the inert gas and the flow of the process gas maintain a mass fraction of the process gas between about 0.1 and about 0.2 at the edge region while preventing the process gas from diffusing into the center region.

10. The method of claim 9, wherein a flow rate of the process gas is a fraction of a flow rate of the inert gas.

11. The method of claim 9, further comprising;
   mixing an inert gas into a flow of the etchant gas over the edge region while maintaining the flowing of the inert gas into the center region.

12. The method of claim 9, wherein the flow of the process gas consists essentially of oxygen.

13. The method of claim 11, wherein a flow rate of the inert gas mixed with the flow of the process gas is greater than both a flow rate of the process gas and a flow rate of the inert gas into the center region.

14. The method of claim 9, further comprising:
maintaining a pressure in the edge region of between about 1 Torr and 2 Torr.

15. The method of claim 9 wherein the cleaning of the bevel edge is completed without inserts placed over the substrate.

16. The method of claim 9, wherein a mass fraction of the etchant gas in the center region is maintained at about zero during the cleaning.

17. The method of claim 11, wherein a molecular weight of the inert gas in the mixture is less than a molecular weight of the inert gas flowing to the center region.

18. The method of claim 11, wherein the inert gas flowing into the center region is a same gas as the inert gas mixing with the etchant gas.

19. The method of claim 1, wherein the striking of the plasma occurs between a pair of annular electrodes with an electrode disposed above the substrate and an electrode disposed below the substrate, the pair of electrodes spaced apart from a substrate support.

20. The method of claim 9, wherein the opposing annular electrodes are spaced apart from a substrate support.

* * * * *